(12) United States Patent
Dobos et al.

(10) Patent No.: US 6,522,983 B1
(45) Date of Patent: Feb. 18, 2003

(54) TIMEBASE CALIBRATION METHOD FOR AN EQUIVALENT TIME SAMPLING DIGITIZING INSTRUMENT

(75) Inventors: Laszlo Dobos, Beaverton, OR (US); Kenneth J. Lester, Sherwood, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/799,742

(22) Filed: Mar. 5, 2001

(51) Int. Cl.[7] ............................................... G01D 18/00
(52) U.S. Cl. ......................................... 702/89; 356/5.08
(58) Field of Search .......................... 702/89; 356/5.08; 348/445; 345/157

(56) References Cited

U.S. PATENT DOCUMENTS

| | | | |
|---|---|---|---|
| 4,569,599 A | * 2/1986 | Bolkow et al. | ............ 356/5.08 |
| 4,766,559 A | 8/1988 | Laszlo | |
| 5,959,479 A | 9/1999 | Woodward | |
| 6,049,325 A | * 4/2000 | Alexander | ................... 345/157 |
| 6,288,746 B1 | * 9/2001 | Joo | ............................. 348/445 |

\* cited by examiner

Primary Examiner—John S. Hilten
Assistant Examiner—Xiuqin Sun
(74) Attorney, Agent, or Firm—William K. Bucher

(57) ABSTRACT

A method of calibrating a timebase in a digitizing instrument estimates the frequency of the clock signal from the clock generator that clocks a coarse delay counter in a strobe generator. The dynamic range of the interpolator in the strobe generator is defined in digital-to-analog converter code values as a function of the clock signal period. A linear horizontal look-up table of equally spaced digital-to-analog converter code values is generated over the defined dynamic range of the interpolator. Residual nonlinearities of the interpolator over the defined dynamic range of the interpolator are characterized and scaled to digital-to-analog converter code values. The digital-to-analog converter code values of the characterized residual anomalies are combined with the digital-to-analog converter code values of the linear horizontal look-up table to generate a horizontal look-up table having DAC code value compensating for the nonlinearities of the interpolator.

19 Claims, 13 Drawing Sheets

TIMEBASE CALIBRATION METHOD FOR AN EQUIVALENT TIME SAMPLING DIGITIZING INSTRUMENT

BACKGROUND OF THE INVENTION

The present invention relates generally to time calibration of a measurement instruments and more particularly to a timebase calibration method for a sampling instrument, such as a equivalent time sampling oscilloscope.

An equivalent time sampling oscilloscope acquires a waveform record of a repetitive input signal in response to strobe pulses generated by the oscilloscope timebase. The timebase includes trigger circuitry, a voltage controlled oscillator and a strobe generator. The oscilloscope also includes front panel controls for setting acquisition and display parameters. The acquisition parameters include the time per division setting, acquisition window, sample spacing and the like. The acquisition parameters are interpreted by a controller, operating under program control, to produce the timebase parameters for generating the strobe pulses. The acquired waveform record is digitized and stored in oscilloscope memory for additional processing and display.

The voltage controlled gated oscillator is phase locked to a fixed reference clock provided in the oscilloscope. The oscillator initiates a clock signal upon receiving a trigger signal from the trigger circuitry. The strobe generator includes clock counter circuitry that provides a coarse delay and an interpolator for providing a fine delay. The controller loads a counter in the clock counter circuitry with a coarse delay value. The clock signal from the gated clock generator increments the counter. The clock counter circuitry generates an output pulse when the counter reaches the loaded terminal count. The output pulse is applied to a ramp generator that initiates a ramp signal that is applied to the intepolator. The controller provides digital-to-analog converter (DAC) codes (fine time delay values) that are converted to an analog values that act as threshold values for the ramp signal. The interpolator generates an output strobe pulse when the ramp generator signal crosses the fine time delay threshold value.

In order to achieve accurate timing and signal sample spacing for the acquired waveform, the frequency and hence the period of the clock signal needs to be known. The fixed clock reference in conjunction with direct counting type frequency measurement support circuitry in the oscilloscope determines the frequency of the gated oscillator. The fixed clock reference is also used to determine the dynamic range of the interpolator and generate a horizontal look-up table of nonlinearity corrected digital-to-analog converter values for the interpolator.

What is needed is a timebase calibration method for a sampling system that does not require direct counting type frequency measurement support circuitry. In addition, the timebase calibration method needs to be capable of determining the clock frequency of multiple clock generators. Further, there is a need for a timebase calibration method that determines the clock frequency of a gated oscillator that is not locked to a fixed reference clock.

SUMMARY OF THE INVENTION

Accordingly, the present invention is a timebase calibration method for an equivalent time sampling digitizing instrument having timebase circuitry that includes a strobe generator having coarse time delay circuitry and fine time delay circuitry. The coarse time delay circuitry receives a first portion of a strobe delay input for loading a counter with a coarse time delay value and the fine time delay circuitry receives a second portion of the strobe delay input for generating an analog input signal to an interpolator in the fine time delay circuitry. The analog signal is derived from a fine time delay look-up table of digital values. The coarse time delay circuitry is responsive to a received clock signal from a clock generator and the interpolator is responsive to the analog signal for generating a variable time delay strobe output pulse. The calibration method estimates the frequency of the clock signal from the clock generator using the power spectrum of the difference frequencies between the clock generator signal and a reference oscillator signal. A dynamic range for the interpolator is defined in digital-to-analog converter code values as a function of the clock signal period based on the variance of the difference of a plurality of acquired waveform record pairs of the calibration oscillator signal. Each record pair is acquired at a selected digital-to-analog converter code value with one record being acquired at a first coarse time delay and the other record being acquired with a second coarse time delay. A linear horizontal look-up table of digital-to-analog converter code value points is generated based on the defined dynamic range of the interpolator wherein the code value points are nominally separated by the same number of digital-to-analog converter code values. Residual nonlinearities of the interpolator are characterized over the defined dynamic range of the interpolator based on a plurality of waveform records acquired at an estimated zero crossing point of the calibration oscillator signal. The characterized residual anomalies are scaled to digital-to-analog converter code values, and combined with the digital-to-analog converter code values of the linear horizontal look-up table.

The estimation of the clock signal frequency further includes the steps of generating a coarse estimate of the clock signal frequency and using the coarse estimation as a starting point for generating a fine estimation of the clock signal frequency. Both the coarse and fine estimations of the clock signal frequency acquire waveform records at selected frequency settings of the calibration oscillator. An FFT is applied to the waveform records to obtain the frequency spectra of the difference frequencies of the clock signal and the calibration oscillator signal. The frequency where the non-DC component with the maximum power occurred is determined and indexed to frequency bins for the coarse estimation. The frequency data is squared and a second order polynomial curve fit is applied to squared frequency data. The minimum of the polynomial curve fit is selected as the coarse estimate of the clock signal frequency. For the fine estimation, the sideband power of the frequency where the non-DC component with the maximum power occurred is determined and indexed to frequency bins. The first frequency bin having a complete record of sideband powers is selected and a second order polynomial curve fit is applied to the sideband powers associated with the frequency bin. The frequency of the clock signal is calculated by combining the calibration oscillator frequency defined by the minimum of the polynomial curve fit with the difference frequency defined by the selected frequency bin.

The dynamic range of the intepolator is determined using coarse and fine characterization stages with each characterization stage having an iteration terminal count, a fixed end digital-to-analog converter code value, a start digital-to-analog converter code value, and a digital-to analog converter step value for varying the start digital-to-analog converter code value. For each stage an error array is initialized. The start digital-to-analog converter code values for the coarse characterization are the respective minimum and maximum digital-to-analog converter code values. First and second waveform records are acquired of the calibration oscillator signal using the strobe generator output pulses derived from the clock signal with the start digital-to-analog converter code values and the coarse time delay for the second waveform record being incremented by one from the coarse time delay for the first waveform record. A difference record is generated by performing a point-wise subtraction between the two waveform records. A variance value of the difference record is determined and appended to the error array. For each iteration, the start digital-to-analog converter code value is incremented by the digital-to analog converter step value to generate a new start digital-to-analog converter code value. A new pair of waveform record is acquired, the difference between the waveforms and the variance are determined, and the variance is appended to the error array. The acquisition and processing of the waveform pairs is repeated until the iteration count equals the terminal iteration count. A second order polynomial curve fit is generated on the variance values in the error array, and a digital-to-analog converter code value is correlated to the minimum of the polynomial curve fit as either the coarse or fine start digital-to-analog converter code value.

In the preferred embodiment of the invention the iteration terminal count for the coarse characterization is set to 8 and iteration terminal count for the fine characterization is set to 16. The digital-to-analog converter step value in the coarse characterization is set to –600 and the set value in the coarse characterization is set to –50. The start digital-to-analog converter code value for the fine characterization is set to the coarse start digital-to-analog converter code value minus the digital-to-analog converter step value times one-half the iteration terminal count.

The characterization of the residual nonlinearities in the interpolator includes generating first and second duplicate linear horizontal look-up tables from the linear horizontal look-up table of digital-to-analog converter code value points. The calibration oscillator frequency is initialized for a first mode of operation and the first duplicate linear horizontal look-up table is selected. In the preferred embodiment, the calibration oscillator is set to 64/63 times the clock signal frequency. Digital-to-analog converter code values are generated that characterize nonlinearities in the intepolator which are combined with the corresponding linear digital-to-analog converter code value points in the first duplicate linear horizontal look-up table. The calibration oscillator frequency is re-initialized for a second mode of operation and the second duplicate linear horizontal look-up table is selected. The preferred calibration oscillator frequency in the second mode of operation is 64/65 time the clock signal frequency. A second set of digital-to-analog converter code values are generated that characterize nonlinearities in the intepolator and are combined with the corresponding linear digital-to-analog converter code value points in the second duplicate linear horizontal look-up table. The digital-to-analog converter code value points in the linear horizontal look-up table are replaced with a point-wise average of the digital-to-analog converter code value points from the first and second duplicate linear horizontal look-up tables.

The two modes of operation for generating the digital-to-analog converter code values that characterize nonlinearities in the intepolator acquire a waveform record sample of at least two periods of the calibration oscillator signal with the sample interval equal to the calibration oscillator period and the horizontal position to a zero crossing of the calibration oscillator signal. The mid-point of the first positive transition in the acquired waveform record is determined and another waveform record is acquired over a linear portion of the calibration oscillator signal starting at the mid-point of the positive transition. The slope of the waveform record over a linear portion of the calibration oscillator signal is determined by generating a third order polynomial curve fit on the waveform record and taking the $x^1$ coefficient of the polynomial as the slope. A waveform record is generated from a point-wise weighted average of a plurality of waveform records that capture at least three complete cycles of the interpolator where each cycle represents a transition of the fine tune delay through the total dynamic range of the interpolator. A record of digital-to-analog converter code values corresponding to the point-wise averaged waveform record is also acquired. A record segment from the point-wise averaged waveform record is extracted that contains the first two complete cycles of the interpolator. A tilt slope for the point-wise averaged waveform record is determined by averaging the mean of each of the first two complete cycles. The tilt slope is subtracted from the point-wise averaged waveform record to generate a tilt record where the slope in the record is removed. A new record segment is generated from the tilt record that is the point-wise average of the first two complete cycles of the interpolator. A third degree polynomial curve fit is generated for the record segment which is scaled using the linear portion of the calibration oscillator signal at the zero crossing to produce digital-to-analog converter code values that characterized the nonlinearities in the interpolator. The odd samples are decimated and the resulting digital-to-analog converter code values are combined with the code values in the duplicate horizontal look-up table to generate a table of digital-to-analog converter code values that characterized the nonlinearities in the interpolator. A point-wise average of the digital-to-analog converter code values in the two duplicate horizontal look-up tables is performed with each averaged value replacing the point value in the horizontal look-up table.

The objects, advantages and novel features of the present invention are apparent from the following detailed description when read in conjunction with the appended claims and attached drawings.

BRIEF DESCRIPTION OF THE DRAWING FIGURES

DETAILED DESCRIPTION OF THE PREFERRED EMBODIMENT

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Part of the description will be presented in terms of operations performed by a digitizing instrument, using terms such as data, values, signal samples, numbers and the like, consistent with the manner commonly employed by those skilled in the art to convey the substance of their work to others skilled in the art. As is well understood by those skilled in the art, these quantities take the form of electrical, magnetic, or optical signals capable of being stored, transferred, combined and otherwise manipulated through mechanical and electrical components of the digitizing instrument; and the term digitizing instrument includes general purpose as well as special purpose data processing machines, systems, and the like, that are stand alone, adjunct or embedded.

Additionally, various operations will be described as multiple discrete steps in turn in a manner that is most helpful in understanding the present invention, however, the order of description should not be construed as to imply that these operations are necessarily order dependent, in particular, the order of their presentation.

Figure 1:
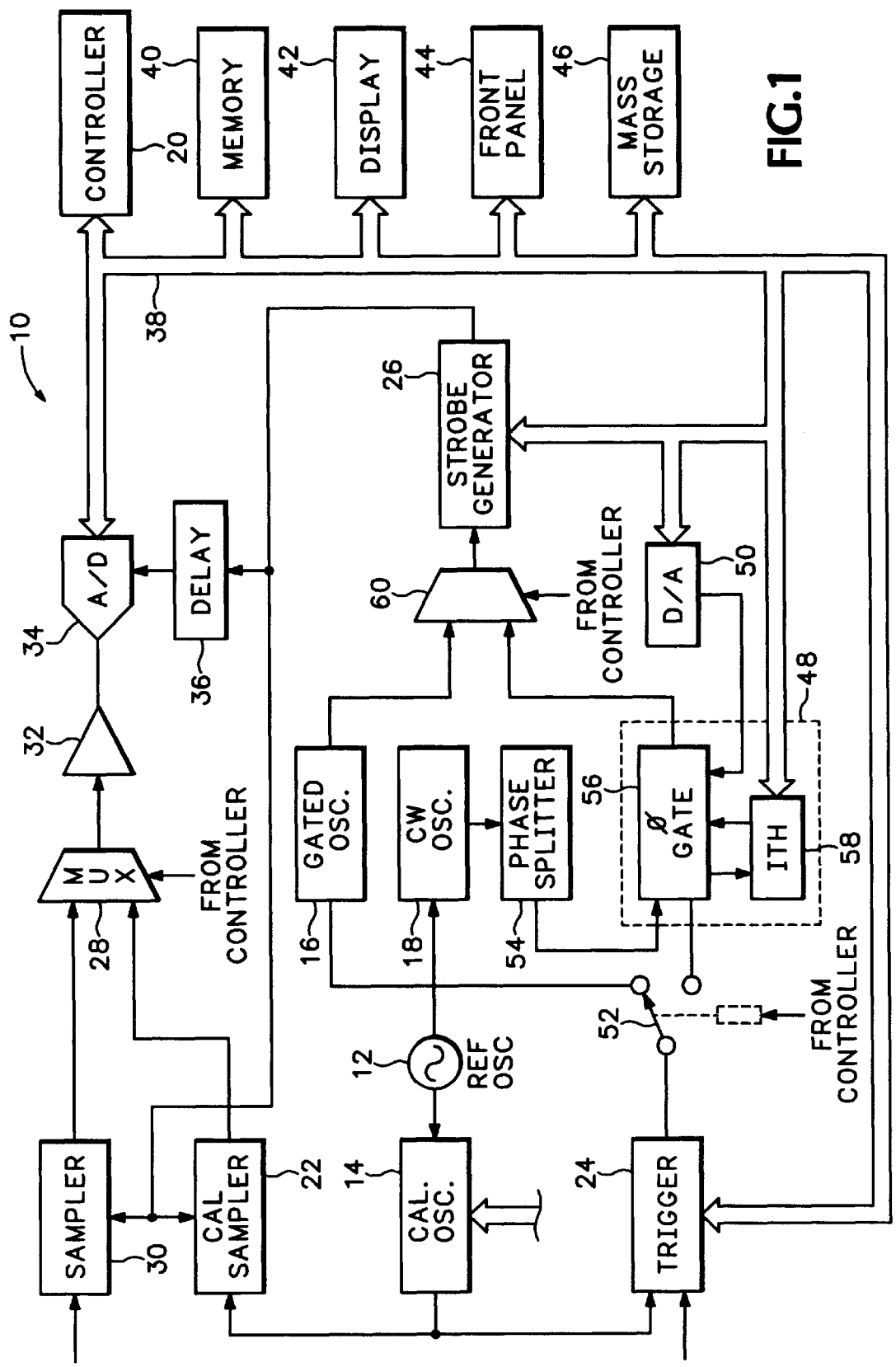
FIG. 1 is a representative block diagram of a digitizing instrument implementing the timebase calibration method according to the present invention.

Referring to FIG. 1, there is shown a representative block diagram of a digitizing instrument 10 implementing the timebase calibration method of the present invention. The digitizing instrument 10 has a reference oscillator 12 that is coupled to calibration oscillator 14 and a continuous wave oscillator 18. The calibration oscillator 14 is preferably a programmable frequency synthesizer locked to the reference oscillator 12. The calibration oscillator 14 generates a variable output signal in response to inputs received from a controller 20. The calibration oscillator output is coupled to a calibration sampler 22 and a trigger circuit 24. The calibration sampler 22 includes sampling diodes that are strobed in response to strobe pulses from a strobe generator 26. The calibration sampler 22 may include strobe shaping circuitry that shapes the strobe pulses and generates differential strobe pulses. The sampled calibration signal is held by a track-and-hold circuit in the calibration sampler and coupled to one input of a multiplexer (MUX) 28. A second input to the MUX 28 receives held signal samples from an input signal sampler 30. The signal sampler 30 receives an optical or electrical input signal that is coupled to sampling diodes within the sampler 30. The input signal is sampled in response to sampling strobes from a strobe generator 26. As with the calibration sampler 22, the input sampler may include strobe shaping circuitry that shapes the strobe pulses and generates differential strobe pulses. A track-and-hold circuit within the sampler 30 holds the sampled signal. Alternately, the strobe generator 26 may include the shaping and differential circuitry for the strobe pulses.

The MUX 28 receives control signals from the controller 20 that selectively couples the held input signal samples or the held calibration signal samples to a buffer amplifier 32 via the MUX output. The buffer amplifier 32 conditions the samples for input to an analog-to-digital (A/D) converter 34. The A/D converter 34 is clocked relative to the strobe pulses from the strobe generator 26, such as by delayed strobe pulses coupled through a delay circuit 36. The digitized samples at the output of the A/D converter 34 are coupled to a system bus 38 and stored in system memory 40 for further processing and displaying.

System memory 40 includes both RAM, ROM and cache memory with the RAM memory storing volatile data, such as the digitized values representative of the input signal or the calibration signal, intermediate timebase calibration values, look-up tables and the like. The system bus 38 couples memory 40 to the controller 20, such as PENTIUM® or Celeron™ microprocessor, manufactured and sold by Intel, Corp., Santa Clara, Calif. The system bus 38 is also coupled to a display device 42, such a liquid crystal display, cathode ray tube or the like, and front panel controls 44 with buttons, rotatable knobs and the like and/or control entry devices, such as a keyboard and/or mouse. A mass storage unit or units 46, such as a hard disk drive, a CD ROM drive, a tape drive, a floppy drive or the like, that reads from and/or writes to appropriate mass storage media, may also be connected to the system bus 38. Program instructions that control the functions of the digitizing instrument 10 may be stored and accessed from the ROM memory 40 or from the mass storage media of the mass storage unit 46. The digitizing instrument 10 in the preferred embodiment of the invention is a PC based system functioning under the overall control of WINDOWS® 98 operating system, manufactured and sold by Microsoft, Corp., Redmond, Wash. Controller 20 and system bus 38 in the block diagram are representative of multiple controllers and busses used in the digitizing instrument 10. A separate controller is used to control the acquisition of digitized samples with DSP controllers processing the signal samples and passing the processed samples to the control processor for display on display device 42.

The system bus 38 is also coupled to the strobe generator 26, the trigger circuit 24, a phase startable clock device 48, and a digital-to-analog (D/A) converter 50. The trigger circuit 24 is also coupled to receive an external trigger signal in addition to the calibration oscillator output signal. The trigger circuit 24 selectively outputs, under program control, the external trigger signal or the calibration oscillator signal. The selected trigger signal is coupled through a switching element 52 to the phase startable clock device 48 or a gated oscillator 16. The phase startable clock device 48 also receives phase shifted sinusoidal signal from the continuous wave oscillator 18 via a phase splitter 54. The phase shifted sinusoidal signals are coupled to a phase gate 56 in the phase startable clock device 48. The phase gate 56 also receives the trigger signal from the trigger circuit 22. An infinite track-and-hold circuit 58 receives phase values from the phase gate 56 and couples replicas of the phase values back to the phase gate 56. The D/A converter 50 is coupled to the phase gate 56 to provide offset and gain correction values to the phase startable clock device 48. In the preferred embodiment, the gain and offset correction values are provided by separate D/A converters. The phase startable clock device is described in U.S. Pat. No. 6,384,657, issued on May 7, 2002 and assigned to the assignee of the instant invention and incorporated in its entirely by reference herein.

The phase startable clock device 48 generates an output signal having a predetermined stable startup phase relative to the trigger input signal. The output signal is conditioned as a clock signal and coupled to one input of a multiplexer or switching circuit 60. The other input of the switching circuit receives a gated clock signal from the gated oscillator. The switching circuit 60 selectively couples the gated or phase controlled clock signal to the strobe generator 26 for establishing a coarse time delay relative increment to the trigger pulse.

Figure 2:
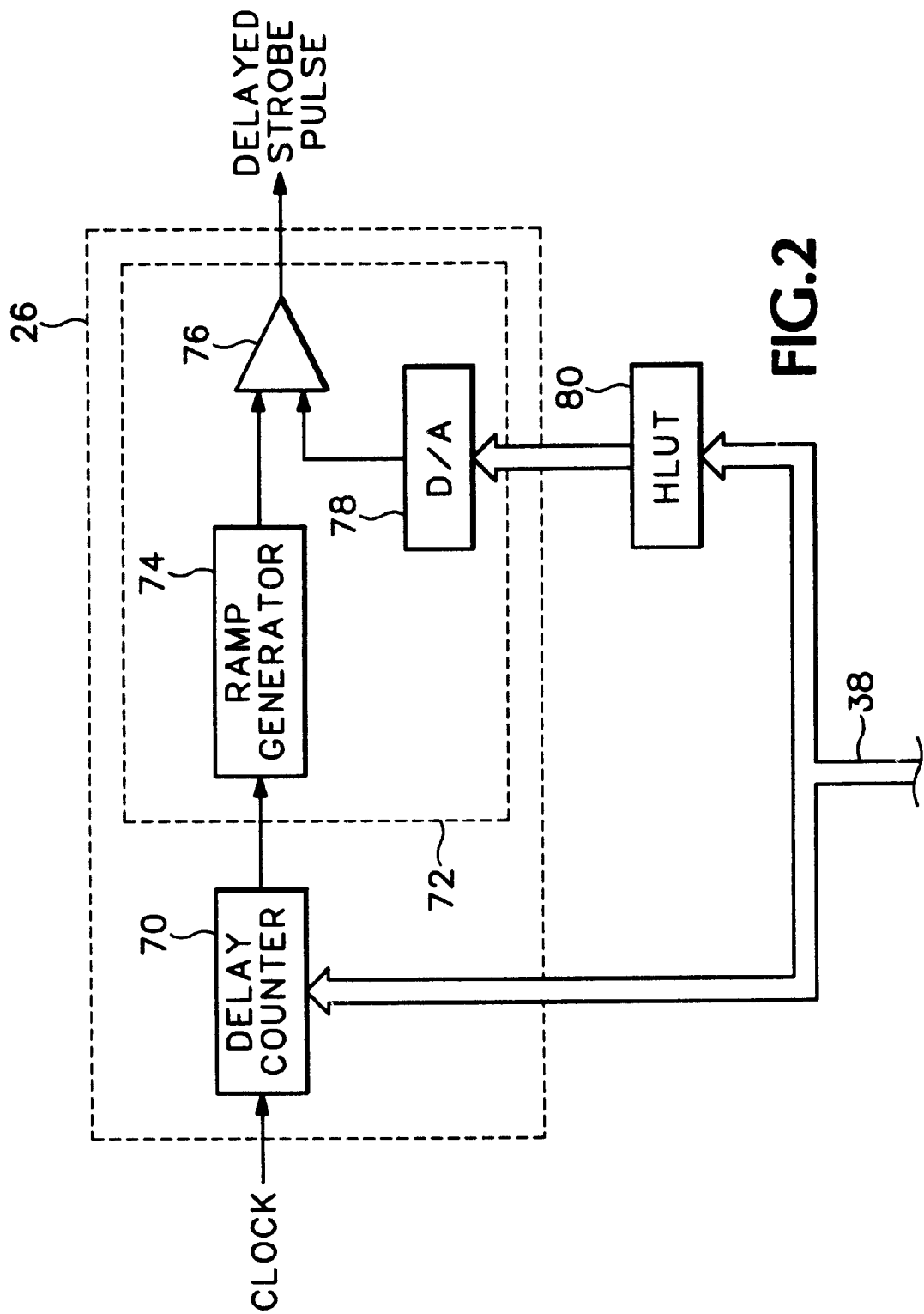
FIG. 2 is a representative block diagram of the strobe generator in the digitizing instrument implementing the timebase calibration method according to the present invention.

Referring to FIG. 2, there is shown a representative block diagram of the strobe generator 26. The strobe generator includes delay counter circuitry 70 coupled to receive the clock signal from either the phase startable clock device 48 or the gated oscillator 16. The counter circuitry 70 is coupled via the system bus 38 to the controller 20 that loads coarse time delay values into the counter 70. The output strobe from the delay counter 70 is coupled to an interpolator circuit 72. In the preferred embodiment of the invention the interpolator circuit generates a 0–3 ns time delay change. The interpolator circuit has a ramp generator 74 that receives the output of the delayed counter 70. The ramp generator 74 initiates a ramp signal that is coupled to the minus input of a comparator circuit 76. The plus input to the comparator circuit 76 is an analog signal from a digital-to-analog converter 78. The D/A converter 78 is a 14 bit device that receives digital-to-analog converter (DAC) code values from a horizontal look-up table 80 to be described in greater detailed below. In the preferred embodiment of the invention, the coarse and fine time delay values are 48-bit fractional words. The upper 30 bits form the integer portion whose units are in strobe delay counter clock cycles, which are provided to the delay counter. The lower 18 bits form the fractional part whose units are in DAC codes values which is provided to the HLUT 80. The fractional part has 18 bits to support high resolution. The HLUT 80 contains DAC values that correct for non-linearities in the interpolator circuit 72. The locations of the fractional part DAC code values are found within the ranges of the corrected DAC code values in the HLUT 80 and interpolated over the found ranges to generate the corrected DAC code to the D/A converter 78. The corrected DAC codes are converted to analog values by the D/A converter 78 and applied to the plus input of the comparator circuit 76. The comparator circuit 76 generates strobe pulses when the ramp signal crosses the analog voltage level on the plus input. The output of the interpolator circuit 72 are strobe pulses that drive the sampling diodes in the calibration sampler 22 and the input signal sampler 30.

The input signal sampler 30, MUX 28, buffer amplifier 32 and A/D converter 34 represent one acquisition channel of the digitizing instrument 10. The digitizing instrument 10 may be configured with multiple acquisition channels with the calibration sampler 22 being multiplexed with each channel. The timebase calibration method of the present invention generates four horizontal look-up tables (HLUT) for each channel of the digitizing instrument 10: cwMain, cwAlt, goMain and goAlt. The selection of a particular HLUT is dependent on whether gated oscillator 16 or the continuous wave oscillator 18 is used to clock the delay counter 70 and the time-per-division setting and the horizontal position setting selected by an operator from the front panel 44. When the continuous wave oscillator 18 is used to clock the delay counter 70, one of the "cw" HLUTs is used. When the gated oscillator 16 is used to clock the delay counter 70, one of the "go" HLUTs is used. A "Main" HLUT is used for large time-per-division values that require changing both the delay counter 70 and the time interpolator 72 in the course of completing the display record. When the horizontal window is sufficiently small to be swept by the time interpolator 72 alone, an "Alt" HLUT may be employed in order to avoid having to "carry" from the time interpolator 72 to the delay counter 70 in the middle of a display record. The choice of "Main" or "Alt" HLUT depends on the horizontal position setting. The timebase calibration method will be described below in relation to generating the goMain HLUT. The process steps for generating the goMain HLUT may be used for the other three generated look-up tables.

Figure 3:
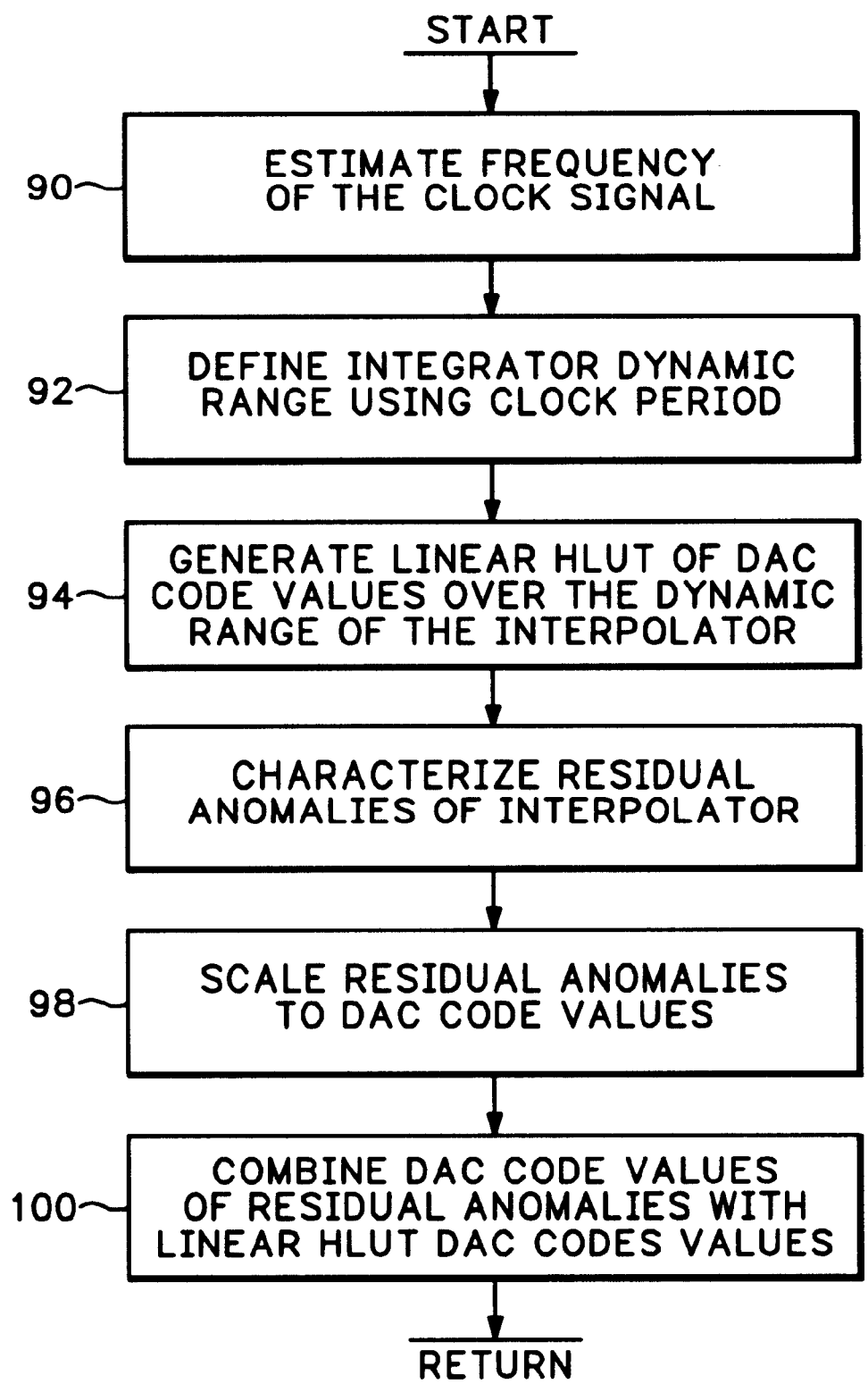
FIG. 3 is a flow chart representing the steps in the timebase calibration method according to the present invention.

Referring to the flow chart of FIG. 3, the steps in calibration the timebase of the present invention include the first step of estimating the frequency of the clock signal from the clock generator source as represented by step 90. With the clock period determined, the dynamic range for the interpolator is defined in digital-to-analog converter code values as a function of the clock signal period as represented in step 92. A linear HLUT is generated over the defined dynamic range of the interpolator having equally spaced digital-to-analog converter code values as represented by step 94. The residual nonlinearities of the interpolator are then characterized over the defined dynamic range of the interpolator as represented by step 96. The characterized residual anomalies are scaled to digital-to-analog converter code values as represented by step 98, and combined with the digital-to-analog converter code values of the linear horizontal look-up table as represented by step 100.

The initial step in the calibration process is to determine the frequency and thus the time period of the gated oscillator 16. The gated oscillator 16 is used for low initial jitter applications at short trigger to observation window delays. The gated oscillator 16 is a delay line based loop oscillator whose frequency of oscillation is not particularly well defined given that the propagation delay of the active low noise limiting amplifier is a sizable component of the self-oscillating period. In the absence of direct counting type frequency measurement support circuitry, indirect frequency domain methods are used based on the acquisition of the programmable internal calibration oscillator 14 waveform.

The indirect measurement method call for programming the calibration oscillator 14 to known frequencies and acquiring waveform records using the programmable timebase driven by the unknown gated oscillator clock. For all of these acquisitions, the internal calibration signal is selected as the trigger source. The only real assumption made in the setup is that by design the gated oscillator 16 frequency is within the tunable range of the calibration oscillator 14.

Since the gated oscillator 16 frequency determination is the first step of the horizontal calibration process, the time interpolator 72 is considered uncalibrated and cannot be used for fine sample spacing control. As a consequence, the sample spacing of any waveform acquisition at this stage will be made equal to one gated clock period (i.e. with zero fractional delay), ensuring that the samples are acquired with a constant time interpolator insertion delay that produces uniform sample spacing.

The initial assumption that the gated oscillator 16 clock is within the frequency range of the calibration oscillator 14 means that the selected sample spacing of one gated clock period will lead to aliased acquisitions in which the resulting waveform lowest non-DC spectral component peaks correspond to the difference frequencies between the gated oscillator 16 and the calibration oscillator 14. The indirect frequency domain method consists of coarse and fine characterization sequence of the aliased waveforms spectrum content versus the uniformly swept calibration oscillator frequency.

Figure 4:
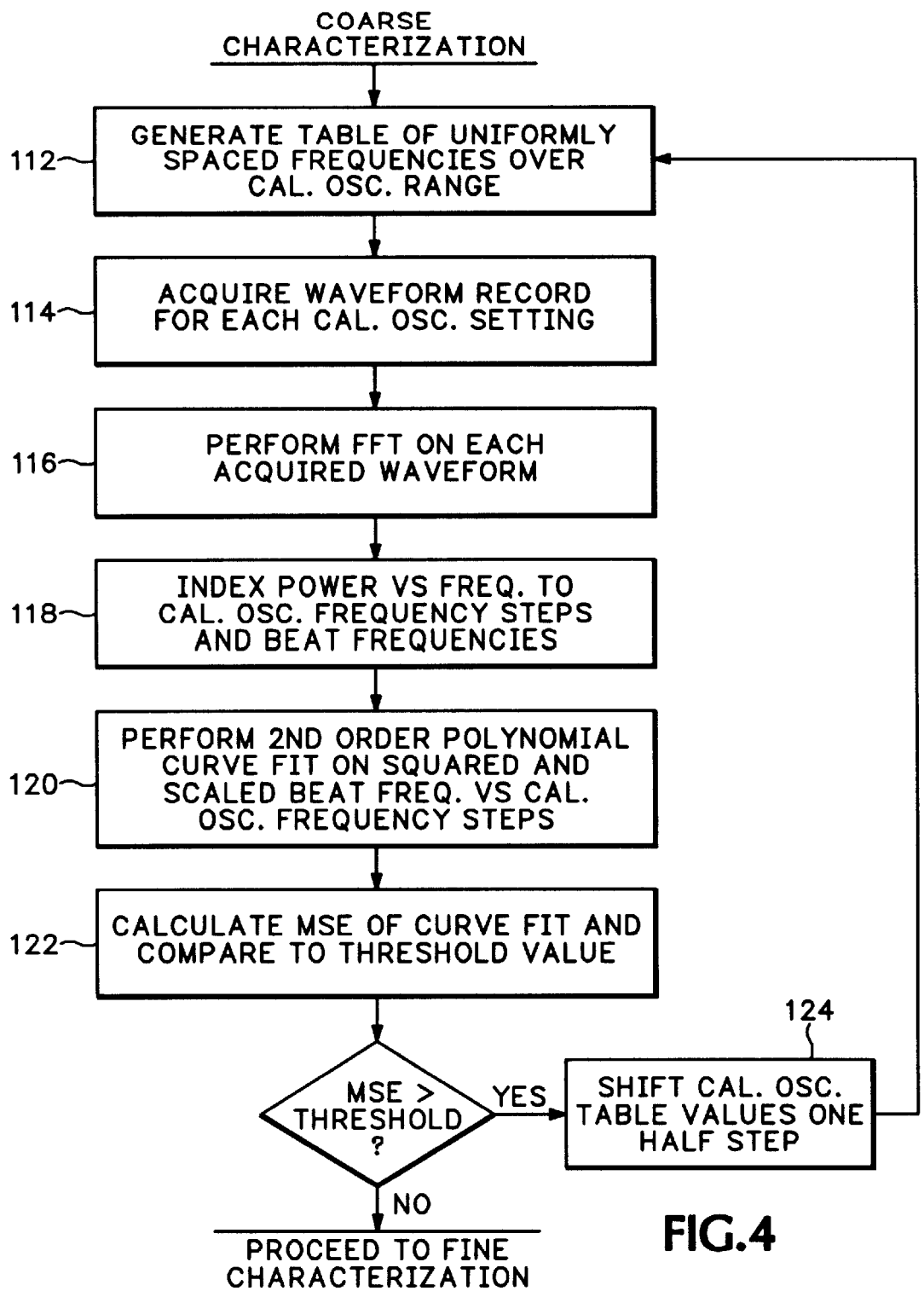
FIG. 4 is a flow chart representing the steps in the coarse characterization of the gated oscillator frequency in the timebase calibration method according to the present invention.
Figure 5:
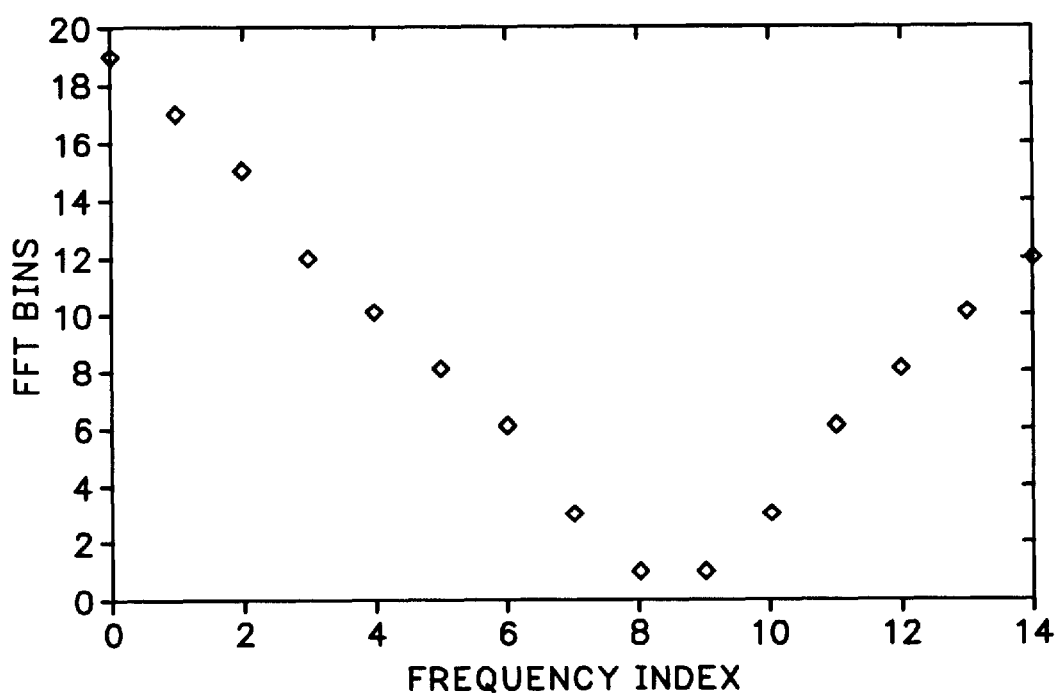
FIG. 5 is a plot of the unscaled beat frequency versus the calibration oscillator frequency in the coarse characterization of the gated oscillator frequency in the timebase calibration method according to the present invention.

The flow chart of FIG. 4 represents the steps in the coarse characterization stage. A table of uniformly spaced frequencies within the tuning range of the calibration oscillator 14 is then generated as represented by step 112. In the preferred embodiment, the uniformly spaced frequencies are 1.6 MHZ apart and results in a table containing approximately 15 frequencies. For each of the calibration oscillator settings, an aliased waveform record is acquired with an arbitrary fixed strobe delay and a sample spacing equal to the gated clock period as represented by step 114. The resulting waveform records represent the difference in frequency between the gated oscillator 16 and the calibration oscillator 14. A Fast Fourier Transform (FFT) is performed on the waveform records and the power spectrum is calculated by taking the point-wise square of each FFT as represented by step 116. For each of the calibration oscillator setting, there is a beat frequency power versus beat frequency record where the non-DC component with the maximum power is the difference in frequency between the gated oscillator 16 and the calibration oscillator 14. The power versus frequency records are then indexed by the calibration oscillator frequency steps (i.e. 0, 1, 2, . . . 14) and the corresponding beat power spectra where the non-DC component with the maximum power occurred as represented by step 118. FIG. 5 is a plot of the unscaled beat frequency versus the calibration oscillator frequency where the horizontal indices correspond to the calibration oscillator frequency steps and the vertical indices correspond to the beat frequency spectra where the non-DC component with the maximum power occurred. Each of the maximum non-DC component power spectra points is squared and scaled to represent the beat frequency versus calibration oscillator frequency. A second order polynomial curve fit is applied to the spectra points and the minimum of the polynomial is taken as the coarse gated oscillator frequency as represented by step 120. The mean square error (MSE) is calculated for the indexed and scaled power spectra points and compared to a threshold value as represented in step 122. In the preferred embodiment, the threshold set is to the standard deviation divided by the maximum beat frequency. The threshold value resulting from the particular system design parameters used to describe the present invention is 0.5. If the MSE is above the threshold, the steps in the calibration oscillator frequency table are shifted by half of a step (0.8 MHZ) as represented by step 124 and the coarse characterization stage is repeated.

Figure 6:
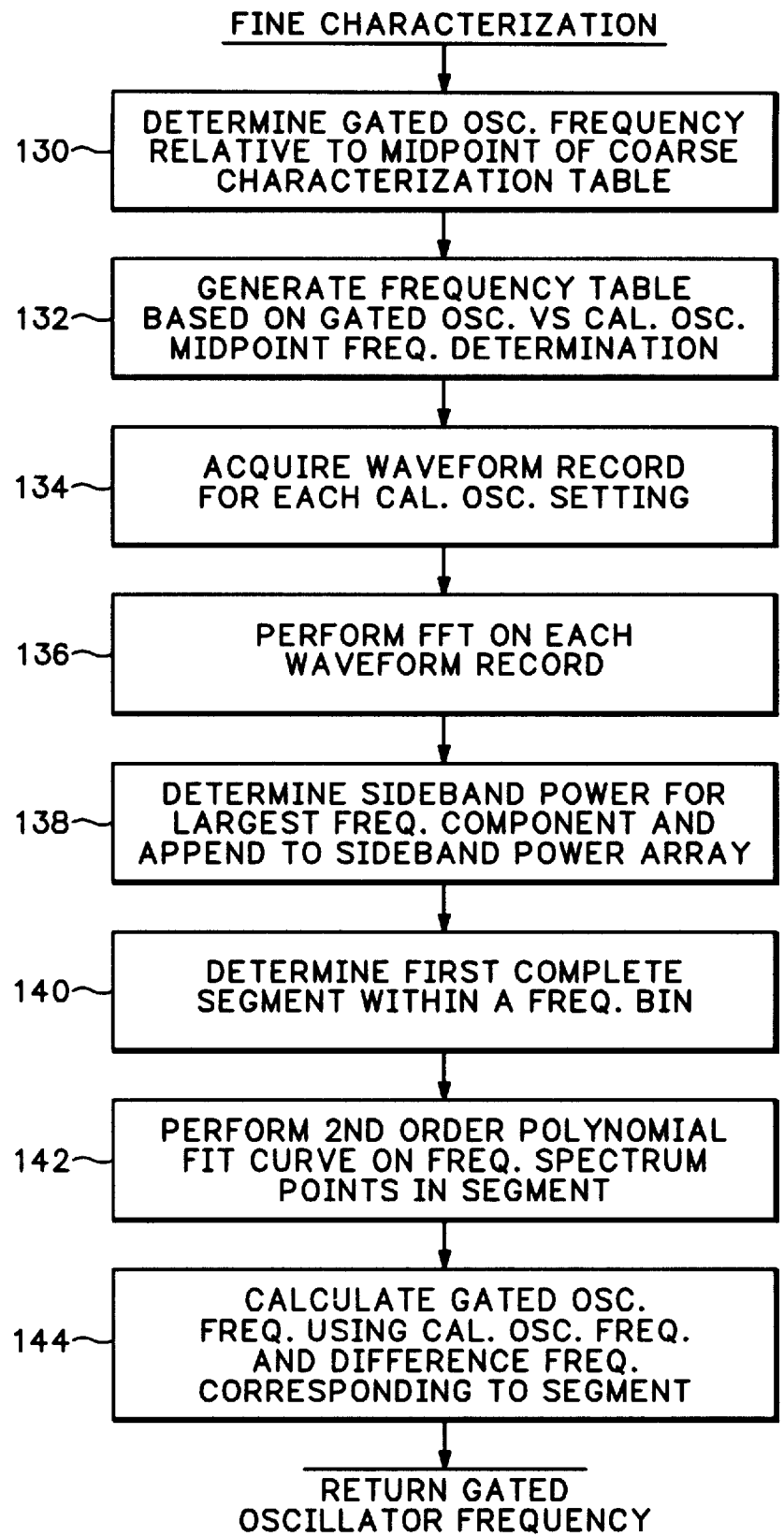
FIG. 6 is a flow chart representing the steps in the fine characterization of the gated oscillator frequency in the timebase calibration method according to the present invention.

Referring to FIG. 6, there is shown the steps in the fine characterization stage of estimating the gated oscillator 16 frequency. A determination is made whether the coarse estimated gated oscillator frequency is more than the midpoint of the coarse characterization table as represented by step 130. If the coarse gated oscillator frequency is above the midpoint, a frequency table is built that ranges from the minimum calibration oscillator frequency to the minimum calibration oscillator frequency plus 50 times 80 KHz in 80 KHz steps. If the coarse gated oscillator frequency is below the midpoint, a frequency table is built that ranges from the maximum calibration oscillator frequency minus 50 times 80 KHz to the maximum calibration oscillator frequency in 80 KHz steps as represented by step 132. The new search range is set so that the calibration oscillator frequency does not cross the gated oscillator frequency. It is understood that the fine characterization frequency table range and steps are by example only and other table ranges and frequency steps may be used without departing from the scope of the invention.

Figure 7:
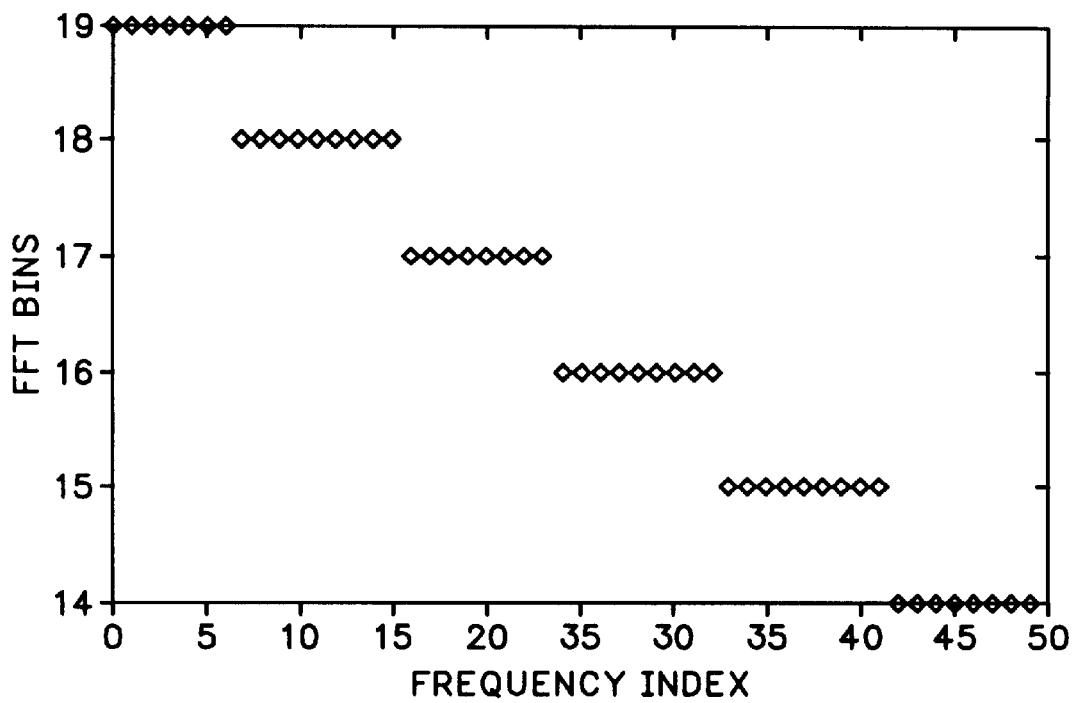
FIG. 7 is a plot of the gated oscillator versus the calibration oscillator difference frequencies associated with FFT bins.
Figure 8:
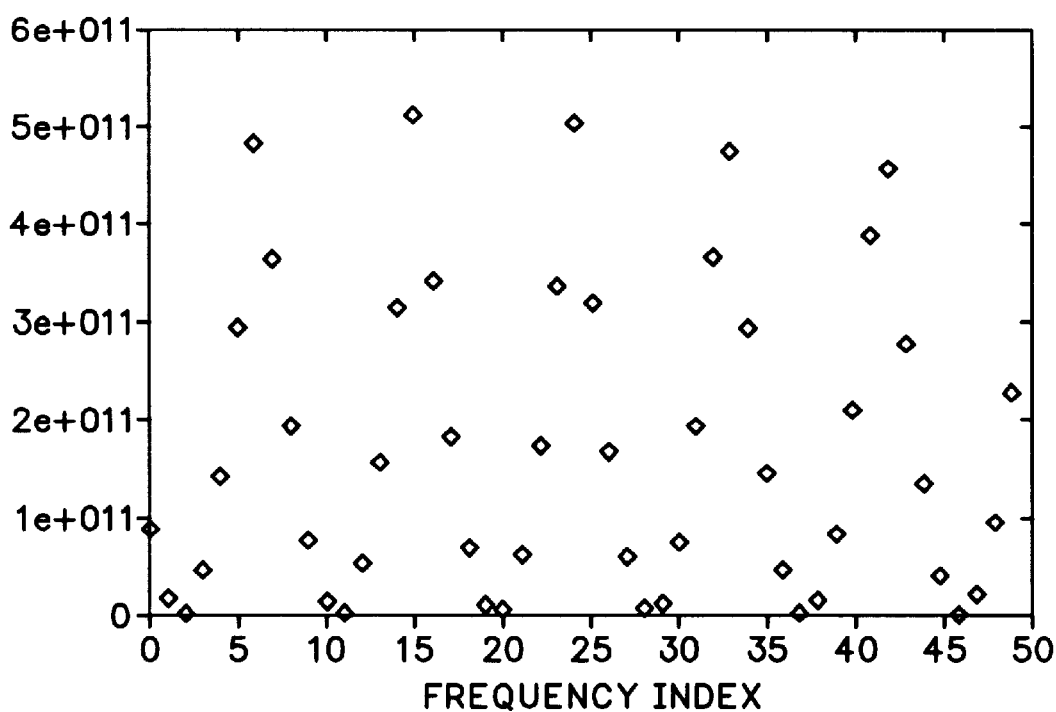
FIG. 8 is a plot of calibration oscillator frequency steps as a function of sideband power of the largest frequency component of the calibration oscillator difference frequency.

For each of the calibration oscillator settings, a waveform record is acquired as represented by block 134. The resulting waveform records represent the difference in frequency between the gated oscillator 16 and the calibration oscillator 14. A Fast Fourier Transform (FFT) is performed on the waveform records and the power spectrum is calculated as represented by step 136. For each power spectrum record, the sideband power of the frequency where the non-DC component with the maximum power occurred is determined and indexed to that component. The two values that lie on the indices to the right and left of the frequency where the non-DC component with the maximum power occurred are added together and appended to a gated oscillator sideband power array along with the index of the frequency having the maximum non-DC component power as represented by step 138. Due to the small frequency increments of the calibration oscillator 14 and the short record lengths over which the FFTs are taken, it takes several increments of the calibration oscillator 14 frequency to shift the difference frequency from one FFT bin to the next as shown in the plot of FIG. 7. The horizontal indices of FIG. 7 correspond to the calibration oscillator frequency steps and the vertical indices correspond to the FFT frequency bins into which the difference frequency between the calibration oscillator and the gated oscillator fall. Thus, the process used for estimating the coarse gated oscillator frequency is not usable for the fine characterization of the gated oscillator frequency. Instead, use is made of the fact that the power spectrum sideband power decreases as the as the records taken approach integer multiples of the record period. The plot of FIG. 8 shows this relationship where the horizontal indices correspond to the calibration oscillator frequency steps and the vertical indices correspond to the sideband power of the largest frequency component. Note that sideband power has minima corresponding to the centers of the frequency bins of FIG. 7.

The first complete segment within a frequency bin is determined as represented by step 140 and a second order polynomial curve fit is performed on the frequency spectrum points in the segment as represented by step 142. The gated oscillator frequency is calculated using the calibration oscillator frequency corresponding to the minimum sideband power and the difference frequency corresponding to the segment used as represented by step 144. If the coarse search gated oscillator is above the calibration oscillator frequency, the difference frequency is subtracted from the calibration oscillator frequency and if the coarse search gated oscillator is below the calibration oscillator frequency, the difference frequency is added to the calibration oscillator frequency.

Once the gated oscillator frequency is determined, the dynamic range of the time interpolator 72 is determined in relation to the D/A converter 78 DAC code range. By design, the time interpolator 72 controllable delay range over the total DAC code range exceeds the gated clock period. The next step in calibration of the timebase is to select a pair of DAC codes for which the insertion delay change matches the gated clock period. Assume that the calibration oscillator 14 frequency $f_{cal}$ is chosen with respect to the gated clock frequency $f_{gck}$ as being:

$$f_{cal} = f_{gck} \times \frac{2^m}{2^m + 1} \quad (1)$$

If the sample spacing for a sequential sampling acquisition is set to equal the gated clock period then the fractional part of the strobe delay for all samples in the record will be the same for the whole record. In other words, the time interpolator DAC code will be the same for the whole record. Due to the above relationship between the gated clock period and that of the calibration oscillator 14, the acquired record will consist of repeated $2^m$ long sequences corresponding to samples taken at $T/2^m$ spacing of one period of the calibration oscillator 14. The phase of the above acquired repeating sequence depends on the initial delay value of the sample in the record which will determine the time interpolator DAC code value for the entire record.

Figure 9A:
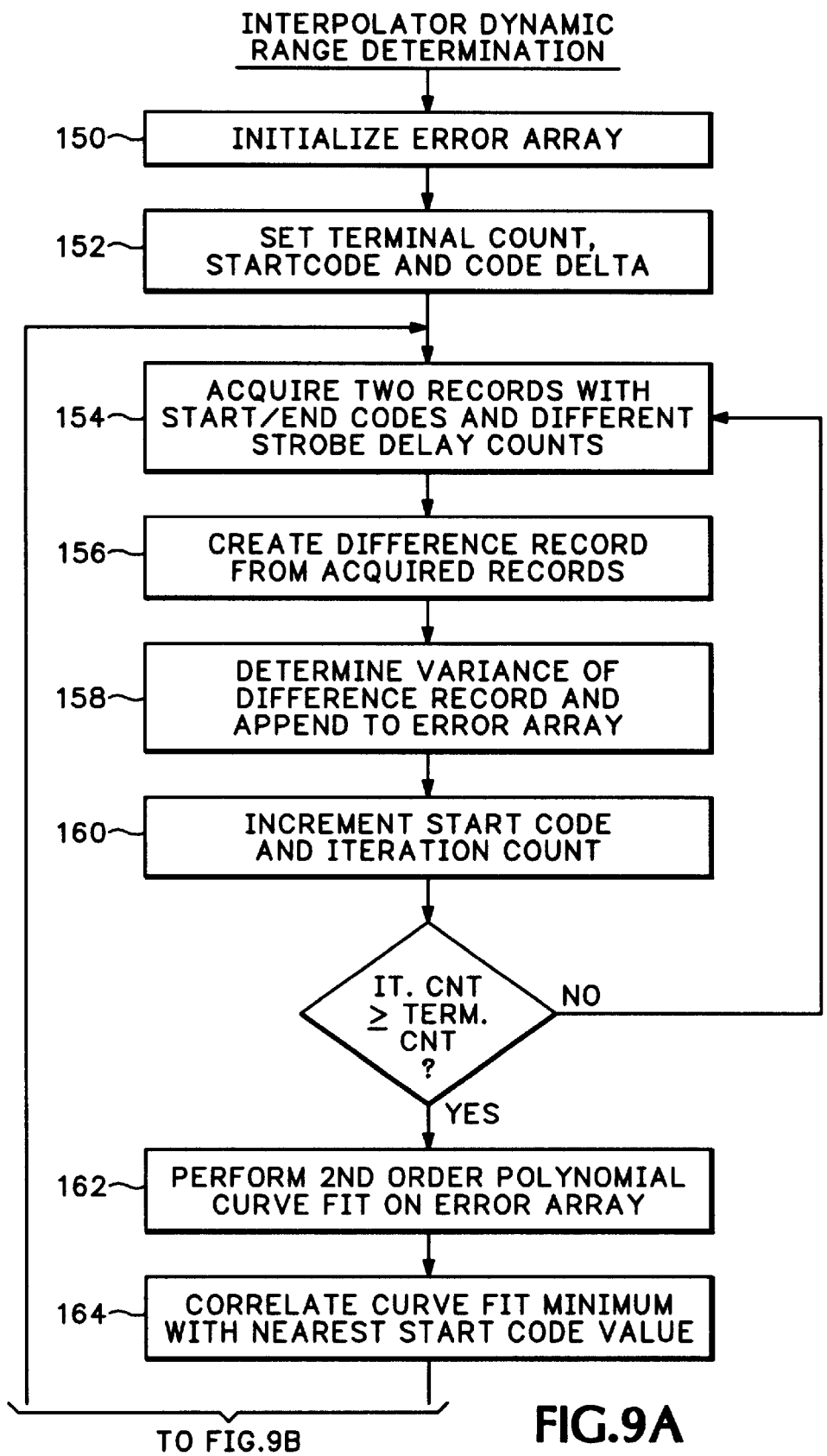
FIGS. 9A and 9B are a flow chart representing the steps in determining the dynamic range of the interpolator in the timebase calibration method according to the present invention.
Figure 9B:
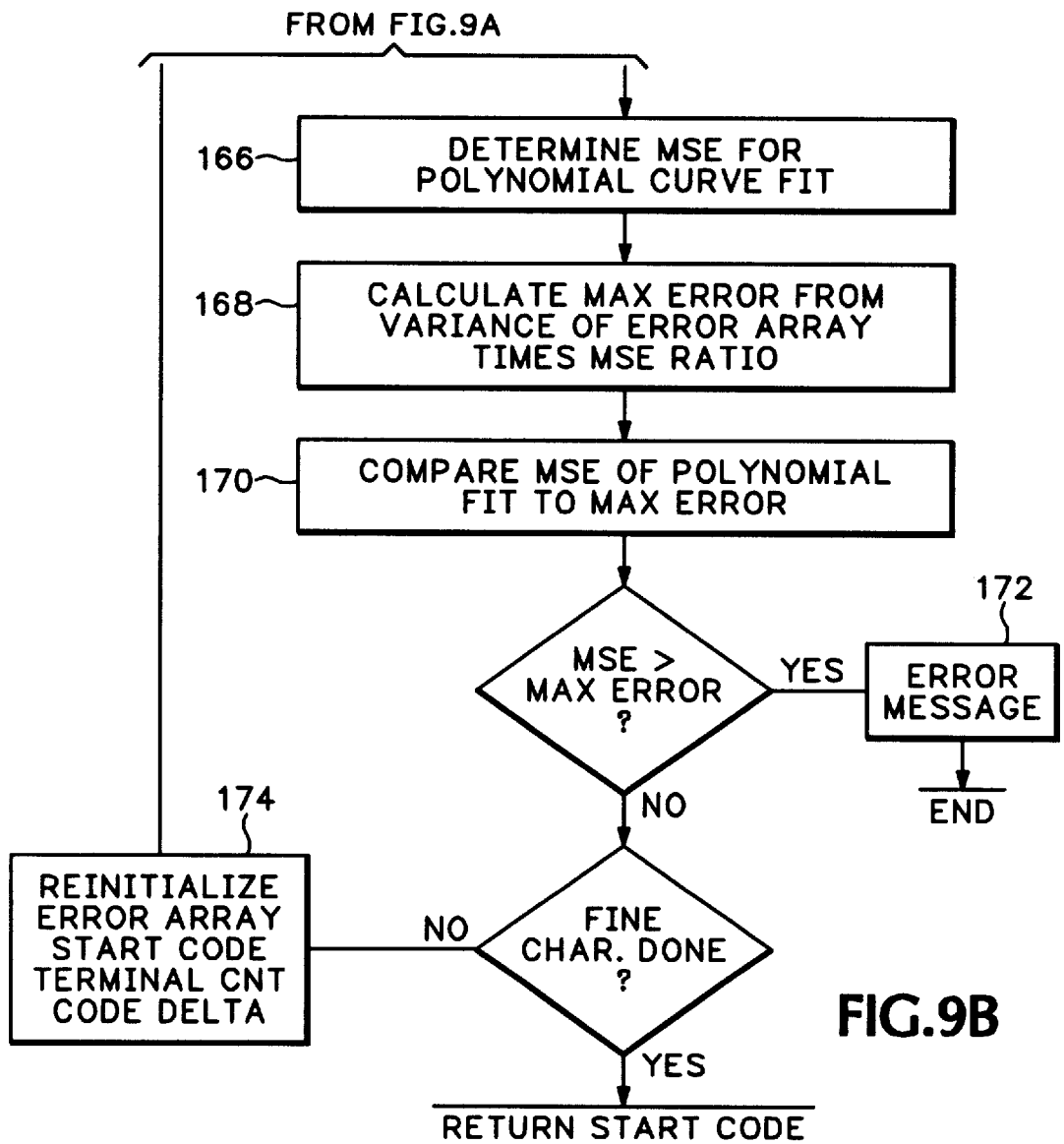

The flow chart of FIGS. 9A and 9B represents the steps in determining the dynamic range of the interpolator 72 in relation to the DAC start and end codes. In the below described process, the endCode is held constant and the startCode is adjusted to cause the time interpolator 72 to be one strobe delay counter clock period below the fixed end code. The frequency of the calibration oscillator 14 is set to slightly below the calculated frequency of the gated oscillator 16. The process includes a coarse and fine characterization stages. The first step is to initialize an errorArray to zero as represented by step 150. The next step is to set an terminal iteration count, a startCode and a code step count, called codeDelta, as represented by step 152. The coarse characterization stage has eight iterations and the fine characterization stage has 16 iterations. The codeDelta for the coarse characterization has a DAC code value of −600 and the fine characterization stage has a DAC code value of −50. The startCode for the coarse characterization is 8000 and the startCode for the fine characterization is the determined startCode from the coarse characterization minus the fine characterization codeDelta times fine characterization iteration divided by two.

The next step is to acquire two sets of sample records with the two records having the endCode and startCode respectively but with the second record acquired with the strobe delay counter incremented by one as represented by step 154. In the preferred embodiment, the records contain 512 samples. The two sample records are subtracted from each other to create a difference record as represented by step 156. The variance of the difference record is determined and appended to the errorArray as represented by step 158. The startCode and iteration count are incremented and two new sets of sample records are acquired and processed to generate another variance value that is stored in the errorArray as represented by step 160. Record acquisition and processing continues until the iteration count equals the terminal iteration count. The variance of the difference records decreases as the startCode approaches the time period of the gated oscillator and increases as it moves away from the time period. A second order polynomial curve fit is applied to the values in the errorArray and the minimum of the resulting continuous curve is determined as represented by step 162. The minimum is interpolated to the nearest start-Code DAC value as represented by step 164 The mean squared error of the polynomial curve fit is determined as represented by step 166. The variance of the errorArray is determined and multiplied by a predefined mean squared error ratio to determine a maximum mean squared error (maxError) as represented by step 168. In the preferred embodiment the mean squared error ratio is 0.15. The MSE of the polyfit curve is compared to the maxError as represented by step 170 and an error message is generated if the mean squared error for the polyfit curved is greater than the maxError as represented by step 172.

The terminal iteration count, startCode, the codeDelta and the errorArray are reset for the fine characterization stage as represented by block 174. The process of acquiring record samples, determining the difference and variance of the records, loading the errorArray with the variance values, generating the polynomial curve fit, determining the minimum of the curve fit, generating the maxError and the means squared error of the polynomial curve are repeated for the fine characterization stage parameter values. The minimum of the continuous polynomial curve fit is rounded to the nearest integer startCode value. The resulting digital-to-analog converter code range from the determined minimum error startCode to the fixed endCode defines the dynamic range of the interpolator 72 as a function of the period of the coarse delay time clock.

Figure 10A:
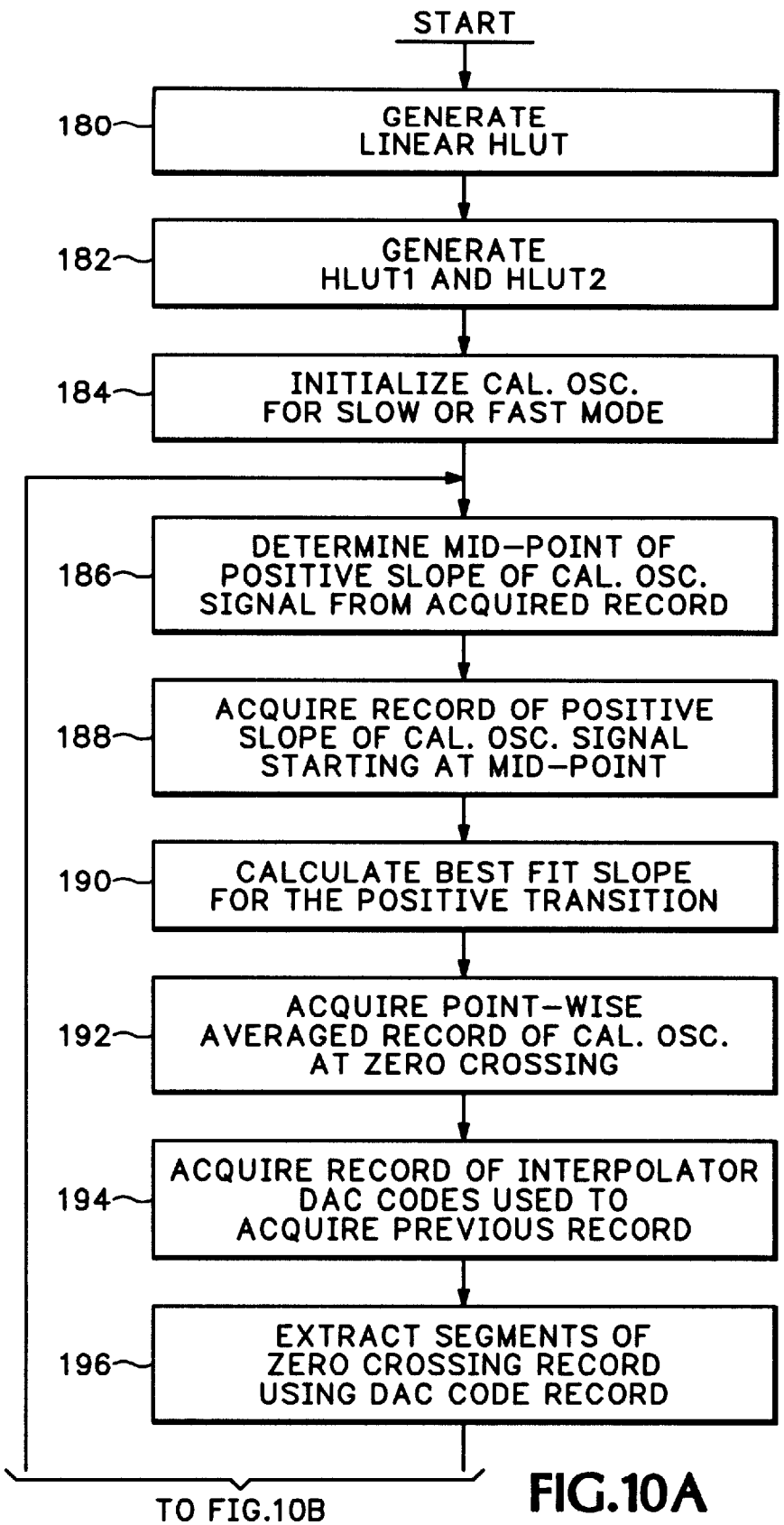
FIGS. 10A and 10B are a flow chart representing the generation of a compensated HLUT in the timebase calibration method according to the present invention.
Figure 10B:
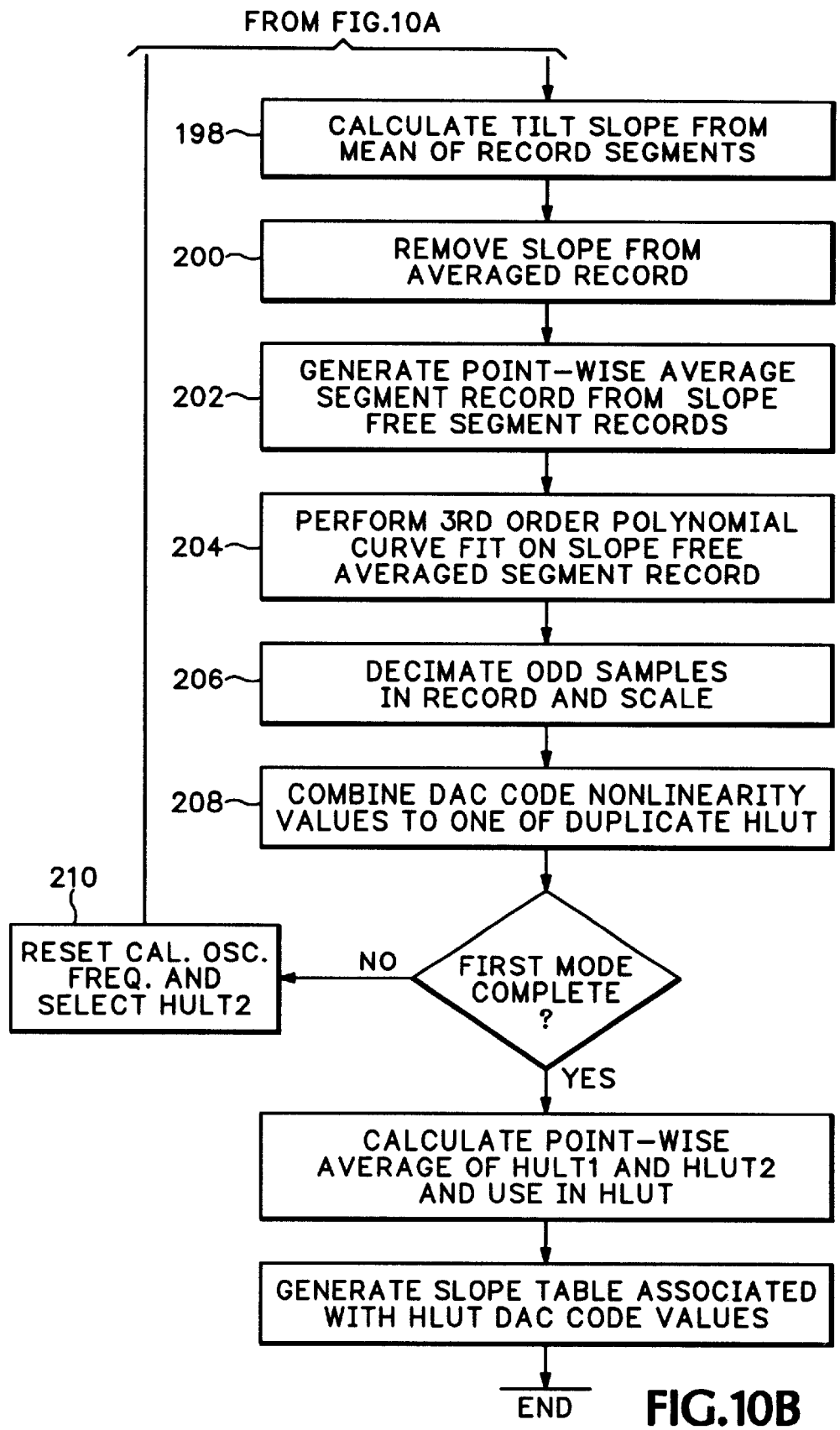

The calibration process continues with the generation of a compensated horizontal look-up table (HLUT) that takes into account the nonlinearities of the interpolator 72 as represented by the flow chart of FIGS. 10A and 10B. The first step is to generate linear HLUT using the digital-to-analog converter startCode and endCode as represented by step 180. In the preferred embodiment, the HLUT is a 32 point table with the startCode and EndCode values being the end values. The range digital-to-analog converter values between the startCode and endCode values are divided such that the DAC code values of the intervening points are linearly arranged. Two additional HLUTs are created, called HLUT1 and HLUT2, that are duplicates of HLUT as represented by step 182. The frequency of the calibration oscillator 14 is then initialized for either a slow mode or fast mode and one of the duplicate HLUTs is selected as represented in step 184. In the preferred embodiment, the calibration oscillator frequency in the slow mode is 64/65×gated oscillator 16 frequency and 64/63×gated oscillator 16 frequency in the fast mode. The slope of the positive crossing of the calibration oscillator signal is then determined as represented by step 186. A record is acquired that contains two periods of the calibration oscillator signal. The index value corresponding to the mid-point of the first positive transition is determined. A sample record, starting at the mid-point, is acquired that is approximately 100 picoseconds long as represented by step 188. The acquired record falls well within the linear region of the calibration oscillator signal near the mid-point. The best slope for the acquired record over the linear region is calculated as represented by step 190. A third order polynomial curve fit of applied to the record and the slope is taken to be $X^1$ coefficient of the polynomial.

Figure 11:
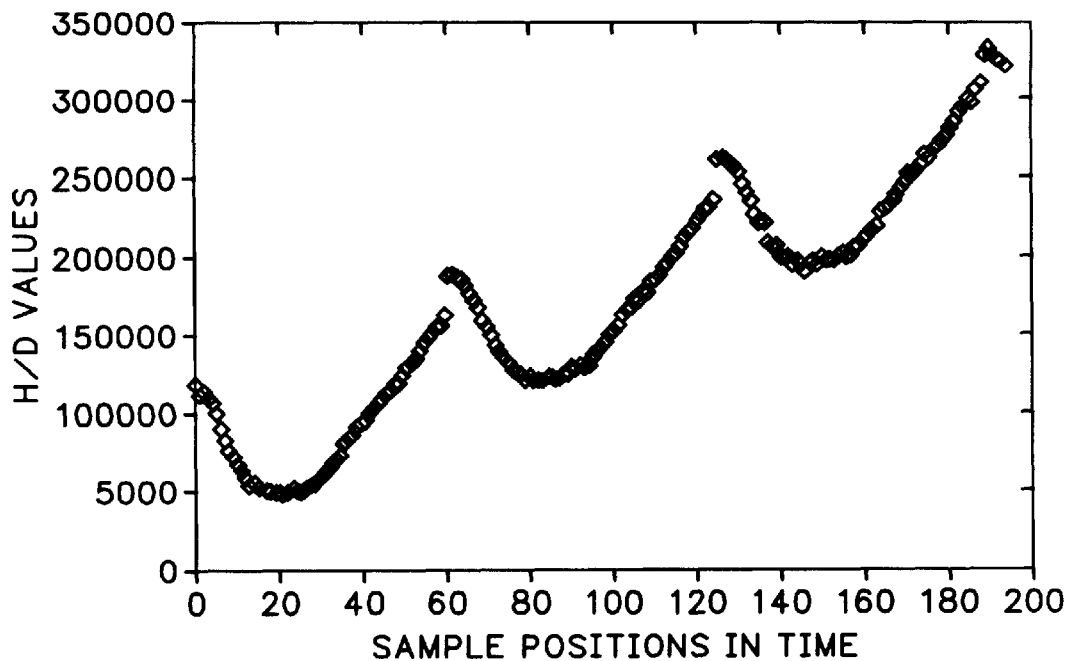
FIG. 11 is a plot of the samples taken at the zero crossing of the calibration oscillator signal in the timebase calibration method according to the present invention.
Figure 12:
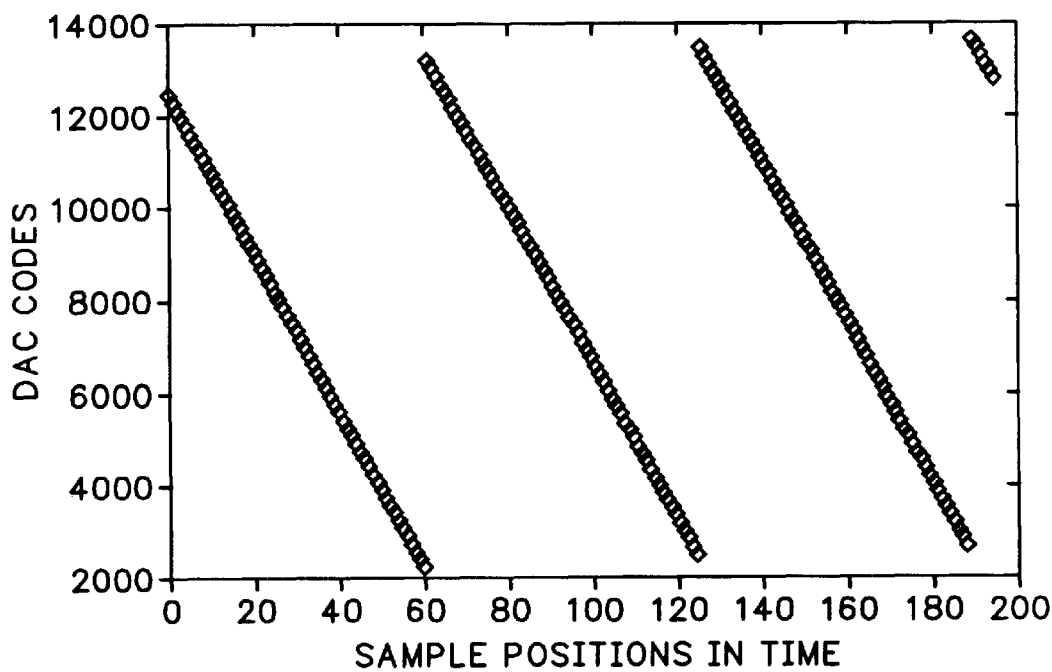
FIG. 12 is a plot of the ADC code values versus sample positions in time corresponding to the samples taken at the zero crossing of the calibration oscillator signal in the timebase calibration method according to the present invention.

The horizontal position is set to the zero crossing of the calibration oscillator signal and the sample interval is set to the slow calibration oscillator frequency. A waveform record is acquired that contains enough samples to capture three complete time interpolator cycles as represented by step 192. Acquiring records with the above settings will cause the time interpolator to wrap every 64 samples. The waveform record is averaged to reduce random noise in the record. In the preferred embodiment, a point-wise weighted average of 64 records is acquired. The plot of FIG. 11 shows the samples taken at the zero crossing of the calibration oscillator signal. The calibration oscillator frequency is set below the gated oscillator frequency so each sample is taken by increasing the delay counter by one and increasing the interpolator DAC code by 1/64 of its range. The vertical deviations are due to the strobe delay timing error. Using the same setting that are used for acquiring the above waveform record, a record is acquired of the interpolator 72 DAC codes used to acquire the above waveform record as represented by step 194. The plot of FIG. 12 shows the interpolator DAC code values versus the sample positioning in time. The first two complete ramp segments in the acquired waveform are extracted using the interpolator DAC codes to identify the complete segments as represented by step 196.

Figure 13:
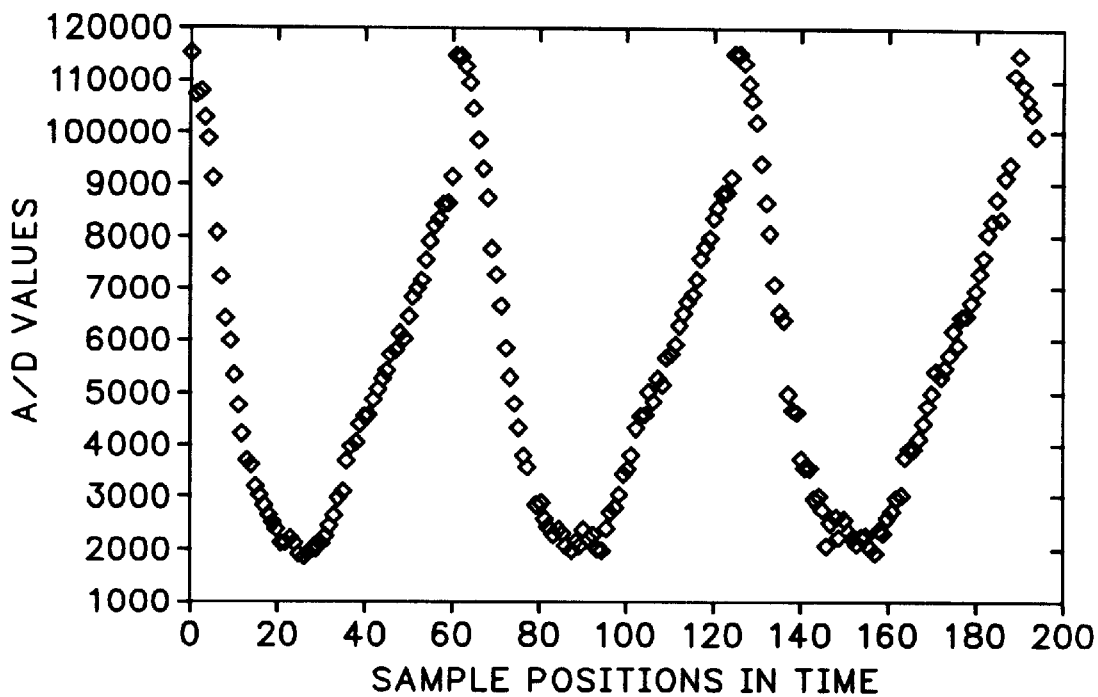
FIG. 13 is a plot of the slope corrected segments samples taken at the zero crossing of the calibration oscillator signal in the timebase calibration method according to the present invention.
Figure 14:
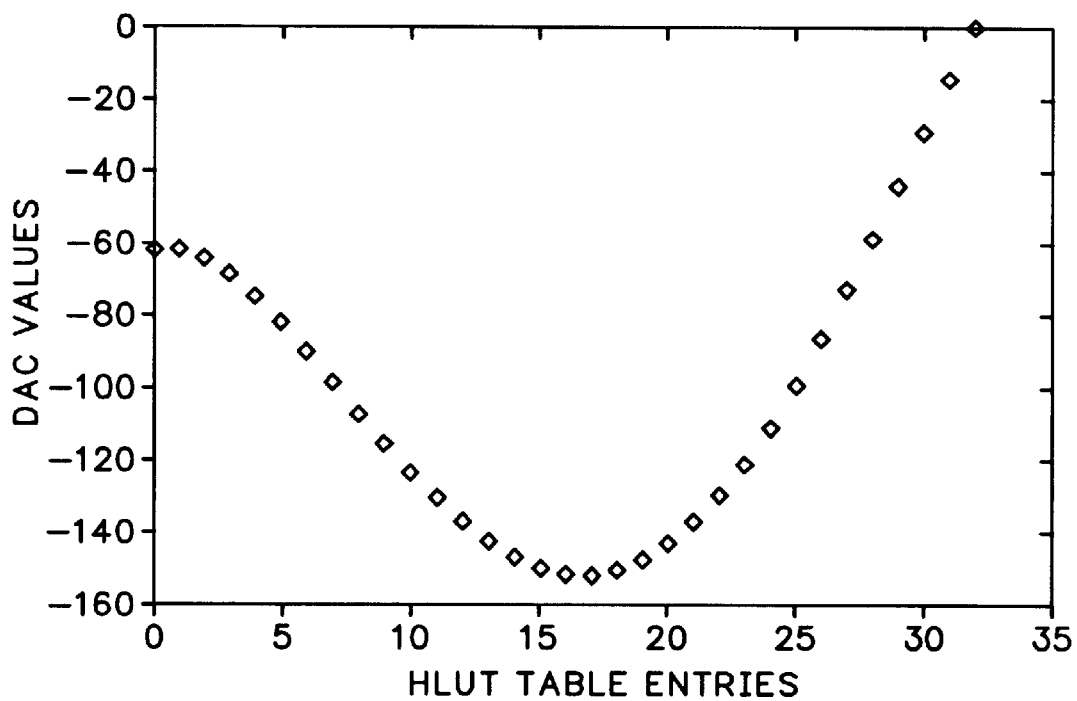
FIG. 14 is a plot of resulting DAC code error values versus HLUT table entries from the third order polynomial curve fit of the slope corrected segments samples in the timebase calibration method according to the present invention.

A tilt slope for the averaged waveform record at the calibration oscillator zero crossing is calculated as the average of the mean of each of the two complete ramp segments as represented by step 198. The slope of the averaged waveform record is removed by subtracting the line Y=tilt×index from the waveform record as represented by step 200. The plot of FIG. 13 shows the resulting waveform record with the tilt removed. A new segment is generated from the waveform record with the tilt removed that is the point-wise average of the first two complete segments as represented by step 202. For the "slow" calibration oscillator frequency setting, the order of the point-wise segment is reversed. This is so the interpolator DAC values that run from less delay to more delay. The point wise segments in the fast and slow modes are mirror images of each other and reversing the order of one or the other of the point-wise segments allows the use of the same processing functions for both the fast and slow modes. A third order polynomial curve fit is applied to the segment record as represented by step 204. The odd samples of the curve fit are decimated and the scaled using the calculated slope of the linear region at the zero crossing of the calibration oscillator frequency as represented by step 206. The plot of FIG. 14 show the resulting DAC code nonlinearity correction values versus segment samples from the third order polynomial curve fit. The DAC code nonlinearity correction values are combined with the respective DAC code values in HLUT1 to generate a horizontal look-up table having DAC code values characterizing the nonlinearities of the interpolator 72 as represented in step 208. The frequency of the calibration oscillator 14 is reset to the "fast" mode and the unused duplicate HLUT table is selected as represented in step 210. The previously described steps are repeated to generate a HLUT2 for the "fast" mode having DAC code values characterizing the nonlinearities of the interpolator 72. The DAC code values in HLUT are set to a point-wise average of the respective DAC codes in HLUT1 and HLUT2 as represented by step 212. A slope table is generated for linearly interpolating between the respective DAC codes in the HLUT as represented by step 214.

The above described process for generating gated oscillator 16 the "goMain" HLUT is also useable for generating the continuous wave oscillator 18 "cwMain" HLUT and the "goAlt" HLUT and the "cwAlt" HLUT.

The digitizing instrument 10 used to describe the timebase calibration method of the present invention is shown having an internal calibration oscillator 14 and a calibration sampler 22. The timebase calibration method of the present invention may also be implemented using an external calibration oscillator. The external oscillator would be coupled to the external input to the trigger circuit 24 and to the input of the signal sampler 30. As with the internal calibration oscillator 14, the frequency range of the external oscillator needs to cover the frequency range of the gated oscillator 16 and the continuous wave oscillator 18.

The parameter settings described in the timebase calibration method are exemplary for a particular implementation of the invention and other parameter settings may be used for different digitizing instrument. Additionally, the size of the horizontal look-up table in not limited to the size described in the referred embodiment and other sizes may be used without departing from the scope of the appended claims. Further, the calibration method has been described where the dynamic range of the interpolator 72 is determined by fixing the endCode and varying the startcode. The invention may equally be implemented by fixing the start-Code and varying the endCode.

A method of calibrating a timebase in a digitizing instrument has been described where the frequency of the clock signal from the clock generator that clocks a coarse delay counter in a strobe generator is estimated. The dynamic range of the interpolator in the strobe generator is defined in digital-to-analog converter code values as a function of the clock signal period. A linear horizontal look-up table of equally spaced digital-to-analog converter code values is generated over the defined dynamic range of the interpolator. Residual nonlinearities of the interpolator over the defined dynamic range of the interpolator are characterized and scaled to digital-to-analog converter code values. The digital-to-analog converter code values of the characterized residual anomalies are combined with the digital-to-analog converter code values of the linear horizontal look-up table.

It will be obvious to those having skill in the art that many changes may be made to the details of the above-described embodiments of this invention without departing from the underlying principles thereof. The scope of the present invention should, therefore, be determined only by the following claims.

What is claimed is:

1. In an equivalent time sampling oscilloscope having timebase circuitry that includes a strobe generator having coarse time delay circuitry and fine time delay circuitry with the coarse time delay circuitry receiving a first portion of a strobe delay input for loading a counter with a coarse time delay value and the fine time delay circuitry receiving a second portion of the strobe delay input for generating an analog input signal to an interpolator in the fine time delay circuitry derived from a fine time delay look-up table of digital values with the coarse time delay circuitry responsive to a received clock signal from a clock generator and the interpolator responsive to the analog signal for generating a variable time delay strobe output pulse, a method of a calibrating the time base circuitry comprising the steps of:
   a) estimating the frequency of the clock signal from the clock generator based on the power spectrum of difference frequencies between the clock generator signal and a reference oscillator signal to generate a coarse estimation of the clock signal frequency, and a fine estimation of the clock signal frequency based on the coarse estimation of the clock signal frequency;
   b) defining a dynamic range for the interpolator in digital-to-analog converter code values as a function of the clock signal period based on the variance of the difference of a plurality of acquired waveform record pairs of the calibration oscillator signal with each record pair being acquired at selected digital-to-analog converter code values and one record being acquired at a first coarse time delay and the other record being acquired with a second coarse time delay;

c) generating a linear horizontal look-up table of digital-to-analog converter code value points taken from the defined dynamic range of the interpolator wherein the code value points are nominally separated by the same number of digital-to-analog converter code values;

d) characterizing residual nonlinearities of the interpolator over the defined dynamic range of the interpolator based on a plurality of waveform records acquired at an estimated zero crossing point of the calibration oscillator signal;

e) scaling the characterized residual anomalies to digital-to-analog converter code values; and f) combining the digital-to-analog converter code values of the characterized residual anomalies with the digital-to-analog converter code values of the linear horizontal look-up table.

2. The method of calibrating the timebase circuitry as recited in claim 1 wherein the coarse estimation of the clock signal frequency further comprises the steps of:

a) generating a table of uniformly spaced frequency settings within the operating range of the calibration oscillator;

b) acquiring a waveform record for each calibration oscillator frequency settings using strobe generator output pulses derived from the clock signal with each of the waveform records representative of the difference frequency between the clock signal and the calibration oscillator signal;

c) generating a point-wise frequency spectrum record from each of the acquired waveform records representative of the beat node power spectrum;

d) determining a frequency where the non-DC component with the maximum power occurred for each waveform record;

e) indexing the frequencies where the non-DC component with the maximum power occurred to the frequency settings of the calibration oscillator;

f) squaring the indexed frequencies where the non-DC component with the maximum power occurred;

g) generating a second order polynomial curve fit on the squared indexed frequencies; and h) selecting the minimum of the polynomial curve fit as the coarse estimate of the clock generator frequency.

3. The method of calibrating the timebase circuitry as recited in claim 2 further comprises the steps of:

a) determining a mean squared error of the polynomial curve fit;

b) comparing the mean squared error to a threshold value;

c) shifting the calibration oscillator frequency settings by one-half of the spacing between the frequency settings if the mean squared error exceeds the threshold; and d) repeating the steps in the coarse estimation of the clock signal frequency.

4. The method of calibrating the timebase circuitry as recited in claim 1 wherein the fine estimation of the clock signal frequency further comprises the steps of:

a) determining whether the coarse estimate of the clock signal frequency is greater than the mid-point of the coarse characterization table;

b) generating a table of uniformly spaces frequency settings having a defined number of steps (n) and frequency step size (m) starting from the minimum of the calibration oscillator frequency range and ending at (n×m) above the minimum if the clock signal frequency is above the mid-point of the coarse characterization table, and generating a table of uniformly spaces frequency settings starting at (n×m) below the maximum of the calibration oscillator frequency range and ending at the maximum of the calibration oscillator frequency range if the clock signal frequency is below the mid-point of the coarse characterization table;

c) acquiring a waveform record for each calibration oscillator frequency setting using strobe generator output pulses derived from the clock signal and representative of the difference frequency of the clock signal and the calibration oscillator signal;

d) determining a frequency where the non-DC component with the maximum power occurred for each waveform record;

e) estimating sideband power associated with the frequency where the non-DC component with the maximum power occurred for each waveform record;

f) indexing the frequencies and sideband powers where the maximum beat frequency power occurred to frequency bins and to the frequency settings of the calibration oscillator;

g) selecting the first frequency bin having a complete record of sideband powers;

h) generating a second order polynomial curve fit on the indexed sideband powers associated with the selected frequency bin; and i) calculating the frequency of the clock generator signal by combining the calibration oscillator frequency defined by the minimum of the polynomial curve fit with the difference frequency defined by the selected frequency bin.

5. The method of calibrating the timebase circuitry as recited in claim 4 table generating step further comprises the steps of:

a) defining the number of steps (n) at 50; and b) defining the frequency step size (m) at 80 KHz.

6. The method of calibrating the timebase circuitry as recited in claim 1 wherein the defining of the dynamic range of the interpolator further comprises the steps of:

a) initializing an error array, an iteration terminal count, a fixed end digital-to-analog converter code value, a start digital-to-analog converter code value, and a digital-to analog converter step value for varying the start digital-to-analog converter code value;

b) generating a coarse start digital-to-analog converter code value as an estimate of the dynamic range of the interpolator;

c) re-initializing the error array, the start digital-to-analog converter code value based on the coarse start digital-to-analog converter code value, the iteration terminal count, and the digital-to-analog converter step value; and d) generating a fine start digital-to-analog converter start code wherein the fine start digital-to-analog converter step value and the fixed end digital-to-analog converter code value define the dynamic range of the interpolator.

7. The method of calibrating the timebase circuitry as recited in claim 6 wherein the interpolator has a digital-to-analog converter and the initializing step further comprises the steps of:

a) setting the fixed end digital-to-analog converter code value to the maximum digital code value of the digital-to-analog converter;

b) setting the start digital-to-analog converter code value to the minimum digital code value of the digital-to-analog converter;

c) setting the iteration terminal count to 8; and d) setting the digital-to-analog converter step value to −600.

8. The method of calibrating the timebase circuitry as recited in claim 7 wherein the generating of the coarse start digital-to-analog converter code value further comprises the steps of:

a) acquiring a first waveform record of the calibration oscillator signal using strobe generator output pulses derived from the clock signal with the start digital-to-analog converter code value being the second portion of the strobe delay input and the first portion of the strobe delay input being the coarse time delay;

b) acquiring a second waveform record of the calibration oscillator signal using strobe generator output pulses derived from the clock signal with the end digital-to-analog converter code value being the second portion of the strobe delay input and the first portion of the strobe delay input being incremented by one for the coarse time delay;

c) generating a difference record by taking the difference between the first and second waveform records;

d) determining a variance value of the difference record and appending to the error array;

e) incrementing an iteration counter and the start digital-to-analog converter code value by the digital-to analog converter step value to generate a new start digital-to-analog converter code value;

f) repeating steps (a) through (e) until the iteration counter equals the terminal iteration count;

g) generating a second order polynomial curve fit on the variance values in the error array; and h) correlating a digital-to-analog converter code value to the minimum of the polynomial curve fit as the coarse start digital-to-analog converter code value.

9. The method of calibrating the timebase circuitry as recited in claim 8 wherein the re-initializing step further comprises the steps of:

a) resetting the error array to zero;

b) setting the iteration terminal count to 16; and c) setting the digital-to-analog converter step value to −50; and d) setting the start digital-to-analog converter code value to the coarse start digital-to-analog converter code value minus the digital-to-analog converter step value times one-half the iteration terminal count.

10. The method of calibrating the timebase circuitry as recited in claim 9 wherein the generating of the fine start digital-to-analog converter code value further comprises the steps of:

a) acquiring a first waveform record of the calibration oscillator signal using strobe generator output pulses derived from the clock signal with the start digital-to-analog converter code value being the second portion of the strobe delay input and the first portion of the strobe delay input being the coarse time delay;

b) acquiring a second waveform record of the calibration oscillator signal using strobe generator output pulses derived from the clock signal with the end digital-to-analog converter code value being the second portion of the strobe delay input and the first portion of the strobe delay input being incremented by one for the coarse time delay;

c) generating a difference record by taking the difference between the first and second waveform records;

d) determining a variance value of the difference record and appending to the error array;

e) incrementing an iteration counter and the start digital-to-analog converter code value by the digital-to analog converter step value to generate a new start digital-to-analog converter code value;

f) repeating steps (a) through (e) until the iteration counter equals the terminal iteration count;

g) generating a second order polynomial curve fit on the variance values in the error array; and h) correlating a digital-to-analog converter code value to the minimum of the polynomial curve fit as the fine start digital-to-analog converter code value.

11. The method of calibrating the timebase circuitry as recited in claim 8 further comprises the steps of:

a) determining a variance for the error array;

b) generating a threshold value by multiplying the variance of the error array by a constant mean squared error ratio;

c determining a mean squared error of the polynomial curve fit;

d) comparing the mean squared error to the threshold value; and e) generating an error message with the mean squared error of the polynomial curve fit exceeds the threshold value.

12. The method of calibrating the timebase circuitry as recited in claim 1 wherein the defining of the dynamic range of the interpolator further comprises the steps of:

a) initializing an error array, an iteration terminal count, a fixed start digital-to-analog converter code value, an end digital-to-analog converter code value, and a digital-to analog converter step value for varying the end digital-to-analog converter code value;

b) generating a coarse end digital-to-analog converter code value as an estimate of the dynamic range of the interpolator;

c) re-initializing the error array, the end digital-to-analog converter code value based on the coarse end digital-to-analog converter code value, the iteration terminal count, and the digital-to-analog converter step value; and d) generating a fine end digital-to-analog converter end code wherein the fine end digital-to-analog converter step value and the fixed start digital-to-analog converter code value define the dynamic range of the interpolator.

13. The method of calibrating the timebase circuitry as recited in claim 12 wherein the interpolator has a digital-to-analog converter and the initializing step further comprises the steps of:

a) setting the fixed start digital-to-analog converter code value to the minimum digital code value of the digital-to-analog converter;

b) setting the end digital-to-analog converter code value to the maximum digital code value of the digital-to-analog converter;

c) setting the iteration terminal count to 8; and d) setting the digital-to-analog converter step value to −600.

14. The method of calibrating the timebase circuitry as recited in claim 13 wherein the generating of the coarse start digital-to-analog converter code value further comprises the steps of:

a) acquiring a first waveform record of the calibration oscillator signal using strobe generator output pulses derived from the clock signal with the end digital-to-analog converter code value being the second portion of the strobe delay input and the first portion of the strobe delay input being the coarse time delay;

b) acquiring a second waveform record of the calibration oscillator signal using strobe generator output pulses derived from the clock signal with the start digital-to-analog converter code value being the second portion of the strobe delay input and the first portion of the strobe delay input being incremented by one for the coarse time delay;

c) generating a difference record by taking the difference between the first and second waveform records;

d) determining a variance value of the difference record and appending to the error array;

e) incrementing an iteration counter and decrementing the end digital-to-analog converter code value by the digital-to-analog converter step value to generate a new end digital-to-analog converter code value;

f) repeating steps (a) through (e) until the iteration counter equals the terminal iteration count;

g) generating a second order polynomial curve fit on the variance values in the error array; and h) correlating a digital-to-analog converter code value to the minimum of the polynomial curve fit as the coarse start digital-to-analog converter code value.

15. The method of calibrating the timebase circuitry as recited in claim 14 further comprises the steps of:

a) determining a variance for the error array;

b) generating a threshold value by multiplying the variance of the error array by a constant mean squared error ratio;

c) determining a mean squared error of the polynomial curve fit;

d) comparing the mean squared error to the threshold value; and e) generating an error message with the mean squared error of the polynomial curve fit exceeds the threshold value.

16. The method of calibrating the timebase circuitry as recited in claim 14 wherein the re-initializing step further comprises the steps of:

a) resetting the error array to zero;

b) setting the iteration terminal count to 16; and c) setting the digital-to-analog converter step value to −50; and d) setting the end digital-to-analog converter code value to the coarse end digital-to-analog converter code value minus the digital-to-analog converter step value times one-half the iteration terminal count.

17. The method of calibrating the timebase circuitry as recited in claim 16 wherein the generating of the fine end digital-to-analog converter code value further comprises the steps of:

a) acquiring a first waveform record of the calibration oscillator signal using strobe generator output pulses derived from the clock signal with the end digital-to-analog converter code value being the second portion of the strobe delay input and the first portion of the strobe delay input being the coarse time delay;

b) acquiring a second waveform record of the calibration oscillator signal using strobe generator output pulses derived from the clock signal with the start digital-to-analog converter code value being the second portion of the strobe delay input and the first portion of the strobe delay input being incremented by one for the coarse time delay;

c) generating a difference record by taking the difference between the first and second waveform records;

d) determining a variance value of the difference record and appending to the error array;

e) incrementing an iteration counter and decrementing the end digital-to-analog converter code value by the digital-to-analog converter step value to generate a new start digital-to-analog converter code value;

f) repeating steps (a) through (e) until the iteration counter equals the terminal iteration count;

g) generating a second order polynomial curve fit on the variance values in the error array; and h) correlating a digital-to-analog converter code value to the minimum of the polynomial curve fit as the fine end digital-to-analog converter code value.

18. The method of calibrating the timebase circuitry as recited in claim 1 wherein the characterizing of residual nonlinearities in the interpolator further comprises the steps of:

a) generating first and second duplicate linear horizontal look-up tables from the linear horizontal look-up table of digital-to-analog converter code value points within the defined dynamic range of the interpolator;

b) initializing the calibration oscillator frequency for a first mode of operation and selecting the first duplicate linear horizontal look-up table;

c) generating digital-to-analog converter code values that characterize nonlinearities in the interpolator;

d) combining the linear digital-to-analog converter code value points in the first duplicate linear horizontal look-up table with corresponding digital-to-analog converter code values characterizing the nonlinearities in the interpolator;

e) re-initializing the calibration oscillator frequency for a second mode of operation and selecting the second duplicate linear horizontal look-up table;

f) repeating steps (c) and (d) to generate digital-to-analog converter code values that characterize nonlinearities in the interpolator;

g) combining the linear digital-to-analog converter code value points in the second duplicate linear horizontal look-up table with corresponding digital-to-analog converter code values characterizing the nonlinearities in the interpolator; and h) replacing the digital-to-analog converter code value points in the linear horizontal look-up table with a point-wise average of the digital-to-analog converter code value points from the first and second duplicate linear horizontal look-up tables.

19. The method of calibrating the timebase circuitry as recited in claim 18 wherein the generating of the digital-to-analog converter code values that characterize nonlinearities in the interpolator further comprises the steps of:

a) acquiring a waveform record sample of at least two periods of the calibration oscillator signal;

b) determine a mid-point of a first positive transition in the acquired waveform record;

c) acquiring a waveform record over a linear portion of the calibration oscillator signal starting at the mid-point of the positive transition of the calibration oscillator signal;

d) determining the slope of the waveform record over a linear portion of the calibration oscillator signal by generating a third order polynomial curve fit on the waveform record and taking the $x^1$ coefficient of the polynomial as the slope;

e) acquiring a waveform record from a point-wise weighted average of a plurality of waveform records that capture at least three complete aliased cycles of the interpolator where each cycle represents a transition of the fine tune delay through the total dynamic range of the interpolator;

f) acquiring a record of digital-to-analog converter code values corresponding to the point-wise averaged waveform record;

g) extracting a record segment from the point-wise averaged waveform record containing the first two complete aliased cycles of the interpolator;

h) determining a tilt slope for the record segment by averaging the mean of each of the first two complete aliased cycles;

i) subtracting the tilt slope from the record segment to remove the slope in the record;

j) performing a point-wise average of the first two complete aliased cycles of the interpolator in the record segment to generate record segment having an averaged interpolator cycle;

k) generating a third order polynomial curve fit on the averaged interpolator cycle record segment; and l) scaling the polynomial curve using the slope of the waveform record over a linear portion of the calibration oscillator signal to represent delay time error as a function of digital-to analog converter nonlinearity correction values.

\* \* \* \* \*